United States Patent [19]
Rosseli

[11] 3,743,860
[45] July 3, 1973

[54] FULL CYCLE SYNCHRONOUS-SWITCHING CONTROL CIRCUIT

[75] Inventor: Allen J. Rossell, Detroit, Mich.

[73] Assignee: Burroughs Corporation, Detroit, Mich.

[22] Filed: Sept. 16, 1971

[21] Appl. No.: 181,110

[52] U.S. Cl.... 307/252 UA, 307/247 A, 307/252 B, 323/24

[51] Int. Cl.. H03k 17/66, H03k 17/68, H03k 17/72

[58] Field of Search ................ 307/242, 243, 252 B, 307/252 T, 252 UA, 247 R, 247 A, 246, 284, 132 E, 133; 323/24 ZS, 38; 317/148.5 B

[56] References Cited

UNITED STATES PATENTS

| | | | |
|---|---|---|---|
| 3,656,005 | 4/1972 | Lee | 307/252 B X |
| 3,450,891 | 6/1969 | Riley | 323/24 X |
| 3,283,179 | 11/1966 | Carlisle et al. | 307/133 |
| 3,476,879 | 11/1969 | Zenner | 307/247 A |
| 3,486,042 | 12/1969 | Watrous | 307/252 B |
| 3,557,381 | 1/1971 | Henry | 323/24 X |
| 3,651,477 | 3/1972 | Bartlett et al. | 307/252 UA X |
| 3,663,950 | 5/1972 | Bartlett | 307/252 UA X |
| 3,668,422 | 6/1972 | Pascente | 307/133 |

*Primary Examiner*—John W. Huckert
*Assistant Examiner*—L. N. Anagnos
*Attorney*—Charles S. Hall et al.

[57] ABSTRACT

A synchronous-switching circuit for a gate-controlled bidirectional switch controls the flow of power between an alternating current source and a load. The application of a gate-biasing potential at the gate of the bidirectional switch is controlled by a latch-operated reed relay which is "set" and "reset" by a network of logic gates fed by sensing transistors responsive to the random actuation of a power-on/power-off switch and to a predetermined zone or point in the alternating current waveform so as to perform the switching operation only at that point in the alternating current cycle at which the circuit current is approximately zero.

19 Claims, 3 Drawing Figures

Patented July 3, 1973 3,743,860

2 Sheets-Sheet 1

INVENTOR.
ALLEN J. ROSSELL

BY
Charles P. Padgett Jr.
AGENT

FULL CYCLE SYNCHRONOUS-SWITCHING CONTROL CIRCUIT

BACKGROUND OF THE INVENTION

This invention relates generally to a power control circuit for controlling the flow of alternating current from an AC source to a load.

Most conventional power-on/power-off switches are randomly actuated. The load is therefore abruptly connected to or disconnected from a source of alternating current. In most cases, particularly when an inductive load is involved, these abrupt changes in the instantaneous value of the source current may create extreme transient voltages across a reactive load. Furthermore, arcing may occur at the switch contact, and undesirable noise and interference may be generated.

Transient surges are particularly undesirable when the load includes logic circuitry since the surges may change the state of the logic within the circuit to which it is supplying current.

BRIEF SUMMARY OF THE INVENTION

It is therefore, an object of this invention to control the flow of power more precisely between an AC source and a load.

It is the further object of this invention to improve control circuits which switch a power control element on or off only at that point in the AC cycle at which the magnitude of the circuit current is approximately zero.

It is still a further object of this invention to provide a zero-crossing synchronous-switching control circuit which responds to the random actuation of the power-on/power-off switch and to predetermined zones in the AC cycle so as to energize the load from the AC source only at that point in the AC cycle at which the magnitude of the source current is approximately zero.

It is still another object of this invention to provide an improved zero-crossing synchronous-switching control circuit wherein the source of the AC power is disconnected from the load only at that point in the AC cycle at which the value of the load current is approximately zero.

It is still a further object of this invention to provide a peak detector switch wherein detection of the first positive peak after the power-on switch has been activated turns on a switching element which connects an AC source to a reactive load and wherein the load remains energized until the detection of the first negative peak after depression of the power-off switch.

It is yet another object of this invention to provide an improved control circuit which controls the application of power from an AC source to an inductive load so as to eliminate severe transients, noise and interference.

These and other objects of this invention are accomplished by a synchronous switching control circuit wherein a plurality of sensing transistor circuits respond to the random actuation of a power-on/power-off switch and to predetermined zones in the waveform of the alternating current so as to enable a series of logic gates to switch a latching circuit to a first or second stable state. The state of the latching circuit controls the energization of a relay which in turn controls a relay-operated switch. The closure of the relay-operated switch results in the application of a gate-biasing potential to a gate-controlled bidirectional switching element for triggering said switching element to a conductive state only at that point in the AC cycle at which the magnitude of the source current is approximately zero. The opening of the relay-operated switch results in the deactivation of said bidirectional switching element only at that point in the AC cycle at which the magnitude of the load current is approximately zero.

Other objects, features, and advantages of this invention will be readily apparent and better understood by reference to the following detailed description when considered in conjunction with the appended claims and the accompanying drawings wherein:

FIG. 1 is a block diagram showing the synchronous-switching control circuit of this invention; and FIGS. 2A and 2B collectively show a schematic diagram of the synchronous-switching control circuit of this invention.

DETAILED DESCRIPTION OF THE DRAWINGS

Figures 1, 2A:
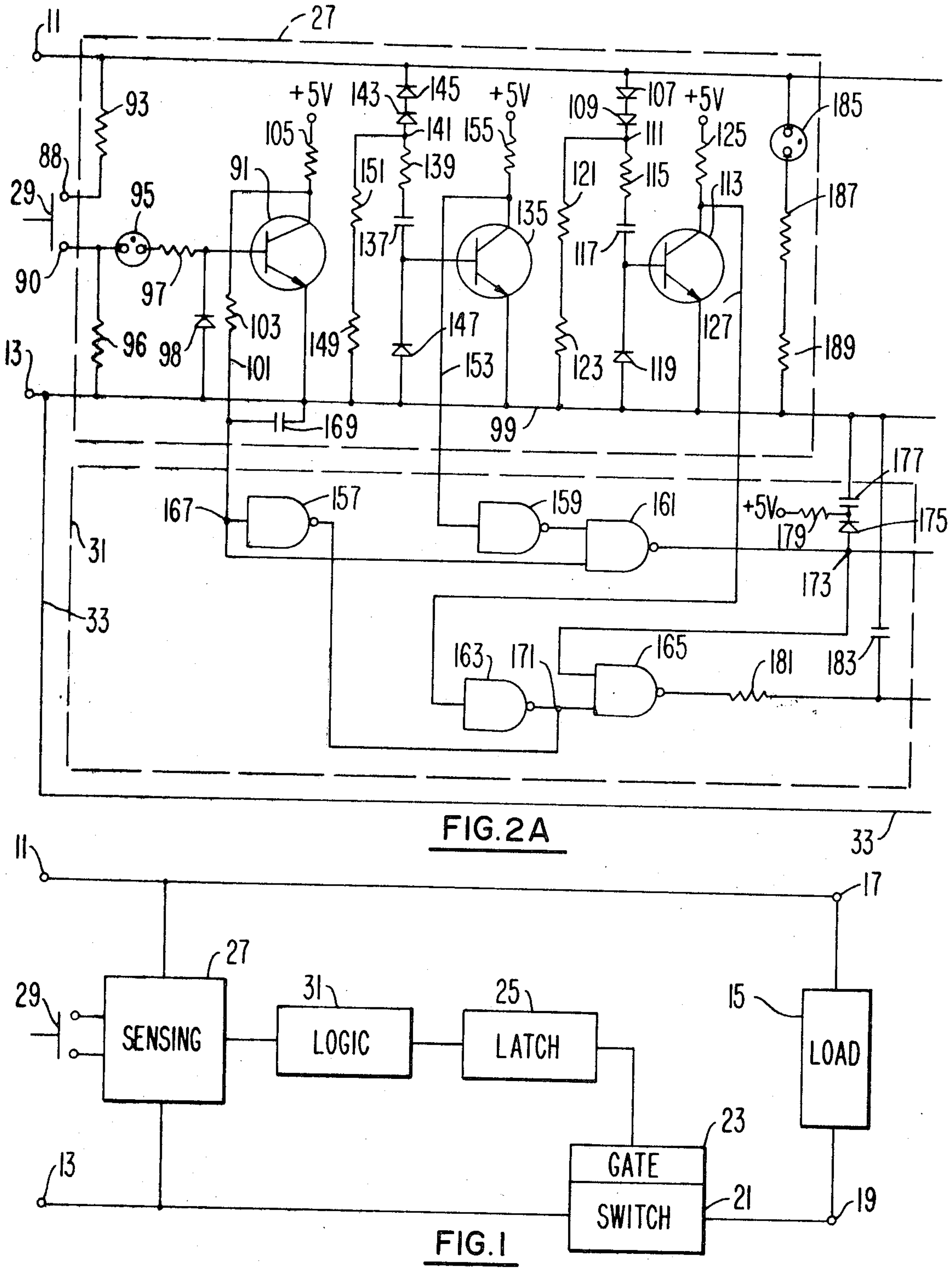

The basic control circuit of this invention will first be described with reference to FIG. 1 which illustrates the synchronous-switching system of this invention in block diagram form. A source of AC power is applied across input terminals 11 and 13 to a load 15, which is usually inductive but which may be purely resistive, connected between terminals 17 and 19. The conduction of power between the input terminals and the load is controlled by means of a gate-controlled bidirectional switching element 21. A gate-biasing network 23 shunts switching element 21 and generates a gate-biasing potential for causing the switching element 21 to switch to a conductive state. Latching circuit 25 controls the gate-biasing network 23 such that when the latching circuit is in a set state, the gate-biasing network 23 applies a gate-biasing potential to the gate of switching element 21 and when the latching circuit 25 is in a reset state, the gate-biasing network 23 removes the gate-biasing potential from the gate of switching element 21.

A sensing network 27 is connected between the AC input terminals 11, 13. This sensing network responds to the random actuation of a power-on/power-off switch 29 and to the waveform of the AC source so as to produce gating signals indicative of the attainment of predetermined zones or points in the AC cycle. Logic network 31 responds to these gating signals and determines whether latching circuit 25 is in the set state or the reset state.

The prime embodiment of this invention is more particularly described with reference to FIGS. 2A and 2B which show a schematic diagram of the synchronous-switching system of this invention.

An AC source, preferably 230 volts, is connected between line inputs 11 and 13, and the load is connected between terminals 17 and 19. A path is thereby provided from the line input 11 through the load and back to line input 13 via is 33 and triac 35. One of the load-carrying electrodes of triac 35 is connected to lead 33 at junction 37 and the other load-carrying electrode of triac 35 is connected to terminal 19 at junction 39. Also connected in shunt across triac 35 between junctions 37 and 39 is a thyractor 41; a series branch including resistor 43 and capacitor 45; and a series branch comrpising neon bulb 47, resistor 49 and resistor 51. Thyractor 41 operates to insure that a voltage spike will not trigger the triac 35 but will be passed by the thyractor and dissipated in the load. The other series branches perform a limiting function and neon bulb 47 is used to indicate the state of the triac 35.

Also connected between the junction 39 and the junction 37 is a series resistive path comprising a resistor 53, relay-operated switch 55, junction 57 and resistor 59. Junction 57 is connected to the gate 61 of triac 35 via zener diodes 63 and 65. Zener diode 63 is poled with its cathode connected to gate 61 and its anode connected to the anode of zener diode 65. The cathode of zener diode 65 is connected to junction 57, the resistor 67 is connected betwen junction 37 and gate 61 of triac 35. This circuitry generates the required gate-biasing potential whenever the relay-operated switch 55 is closed and sufficient voltage is had across junction 39 to junction 37. The zener diodes 63, 65 insure that sufficient voltage is had to provide sufficient current through the triac to latch the triac in its on state when the triac gate is triggered. It will be understood that in operation, triac 35 will not operate continuously but will be re-triggered during each half cycle. Re-triggering will occur as long as sufficient gate-biasing potential is available at gate 61.

The opening of relay-operated switch 55 effectively removes the gate-biasing potential from the gate 61 of triac 35. When the waveform of the load current approaches zero and drops below the minimum holding current required to maintain the conduction of triac 35, conduction will cease as the triac turns itself off. The triac will not re-trigger, when switch 55 is open, as the voltage again increases since the required gate-biasing potential is no longer present at gate 61.

Relay-operated switch 55 is controlled by latch-operated reed relay 69, one end of whose coil is connected to a +5 volt source of DC power and the other end of whose coil is connected to the output of NAND gates 87,89. The common output of NAND gates 87, 89 is also connected to the anode of a spike-suppressing diode 73 whose cathode is connected to the +5 volt end of the relay coil of reed relay 69.

When the output of NAND gates 87, 89 goes low, in response to a high at their inputs, the reed relay 69 is energized, thereby closing relay-operated switch 55. On the other hand, when the output of NAND gates 87, 89 goes high, in response to a low condition at their inputs, reed relay 69 is de-energized, thereby allowing relay-operated switch 55 is open.

The input of NAND gates 87, 89 is controlled by another NAND gate 71 which is controlled by the state of a latch flip-flop comprising NAND gate 75 and NAND gate 77. The output of NAND gate 77 is fed to input 79 of NAND gate 75. The second input of NAND gate 75 is reset input 81. The output of NAND gate 75 is fed to the input of NAND gate 71 and is also fed back to input 83 of NAND gate 77 whose other input is set input 85.

The presence of a set signal (a low) at set input 85 of NAND gate 77 will trigger the bistable flip-flop comprising NAND gates 75 and 77 to a set state and cause the output of NAND gate 75 to go low whereas the presence of a reset signal (a low) at reset input 81 of NAND gate 75 will trigger the flip-flop to the reset state and the output of NAND gate 75 will go high.

The set and reset signals are produced by sensing network 27 and logic network 31 in response to various circuit conditions. The sensing network 27 is connected between AC inputs 11, 13. A first section of sensing network 27 includes circuitry for sensing the actuation or deactuation of a power-on/power-off switch 29. The closure of power switch 29 shorts terminals 88, 90 thereby connecting AC input 11 to the base of a sensing transistor 91 via a series current path comprising resistor 93, terminals 88, 90, neon bulbs 95, and the resistor 97. One end of a resistor 96 is connected between terminal 90 and neon bulb 95 and the other end of resistor 96 is connected at input 13. A protective diode 98 is connected with its anode at input 13 and its cathode to the base of sensing transistor 91. The emitter of sensing transistor 91 is connected to a junction 99 which corresponds to AC input 13, and the collector is connected to lead 101 through resistor 103 and to a +5 volt DC source via resistor 105.

A second section of the sensing circuit 27 is designed to respond in that portion of the AC waveform which is positive. This section is supplied with power from AC input 11 through a diode 107 which is poled with its anode connected to AC input 11 and its cathode connected to the anode of a diode 109 whose cathode is connected to a junction 111. Junction 111 is connected to the base of the peak-detecting or zone-sensing transistor 113 via a series circuit comprising resistor 115 and capacitor 117. The base of transistor 113 is also connected to the cathode of a protective diode 119 whose anode is connected to junction 99. Junction 111 is also connected to junction 99 through a series current path comprising resistors 121 and 123. The emitter of zone-sensing transistor 113 is connected directly to junction 99 and the collector is connected to both a +5 volt source of DC power through resistor 125 and to output lead 127.

Zone-sensing transistor 113 is designed to respond in the positive portion of the AC waveform so as to conduct at a predetermined range or zone in that waveform. A turn-on zone is defined by diodes 107, 109, 119, resistors 115, 121, 123 and capacitor 117. In the prime embodiment herein disclosed, a nearly inductive load was assumed and values were chosen so as to set the limits of the turn-on zone from 70° to 90°, hence for detecting a positive peak.

A third section of sensing network 27 includes a peak-detecting or zone-sensing transistor 135 and is adapted to respond during the negative portion of the AC waveform. The base of zone-sensing transistor 135 is connected to the AC input 11 via a series current path comprising capacitor 137, resistor 139, junction 141 and a diode 143 whose anode is connected to junction 141 and whose cathode is connected to the anode of diode 145 whose cathode is connected to AC input 11. The base of the zone-sensing transistor 135 is also connected to the cathode of a protective diode 147 whose anode is connected to junction 99. Junction 99 is also connected to junction 141 through a series current path comprising resistors 149, 151. The emitter of sensing transistor 135 is connected directly to junction 99 and the collector is connected to both a +5 volt source of DC power through resistor 155 and to output lead 153.

The zone-sensing transistor 135 is adapted to conduct during the negative portion of the AC waveform at a predetermined point or within a predetermined zone therein. A predetermined turn-off zone is defined by diodes 143, 145, 147, resistors 139, 149, 151, and capacitor 137. Again, since the prime embodiment herein disclosed assumed a nearly inductive load, the values of these components were chosen so as to set up a turn-off zone with limits from about 270° to approximately 360°—hence a negative peak.

Output leads 101, 127 and 153 originate at the collectors of sensing transistors 91, 113 and 135, respectively, and are used as the inputs to logic network 31 which includes a series of NAND gates 157, 159, 161, 163 and 165. The input of NAND gate 157 is taken from junction 167 which is connected to output lead 101, and through capacitor 169 to junction 99. The output of NAND gate 157 is connected to junction 171 which comprises the first input of NAND gate 165.

Output lead is connected to the input of NAND gate 159, and the output of NAND gate 159 is connected to the first input of NAND gate 161. -'-. A second input of NAND gate 161 is taken from junction 167, and the output of NAND gate 161 is connected to node 173. Node 173 is connected to AC input 13 via a holding circuit comprising a diode 175 having its anode connected to the junction 173 and its cathode connected to AC input 13 through capacitor 177 and junction 99. The cathode of diode 175 is also connected to a +5 volt DC source through resistor 179.

Junction 173 is further connected to reset input 81 as hereinbefore described and to the second input of the NAND gate 165. The function of the holding circuit comprising diode 175, capacitor 177 and resistor 179 is to hold the junction 173 low when the circuit is initially energized. This disables NAND gate 165 and insures that an initial surge will not trigger the logic circuitry. Once energy has been supplied, the capacitor 177 will be charged from the +5 volt DC source through resistor 179, and junction 173 will be able to go high thereby enabling the previously disabled first input of NAND gate 165.

Output lead 127 from the collector of zone-sensing transistor 113 is connected to the input of NAND gate 163 whose output is connected to junction 171 which forms the second input of NAND gate 165. The output of NAND gate 165 is connected to the set input 85 hereinbefore described through resistor 181, and the junction of resistor 181 and the set input 85 is connected to AC input 13 via capacitor 183. The combination of resistor 181 and capacitor 183 provides a buffer to prevent transients from setting the latch circuit.

It will be understood by those skilled in the art that this invention is not restricted to the use of the specific elements described herein. For example, triac 35 could be any well-known gate-controlled bidirectional current-carrying device having similar characteristics. It will also be understood that the values of the components used to define the turn-on and the turn-off zones may be adjusted depending on the power factor of the load.

It will be observed that FIG. 2A also shows a series current path between AC inputs 11 and 13 comprising neon bulb 185, resistor 187 and resistor 189.

Figure 2B:
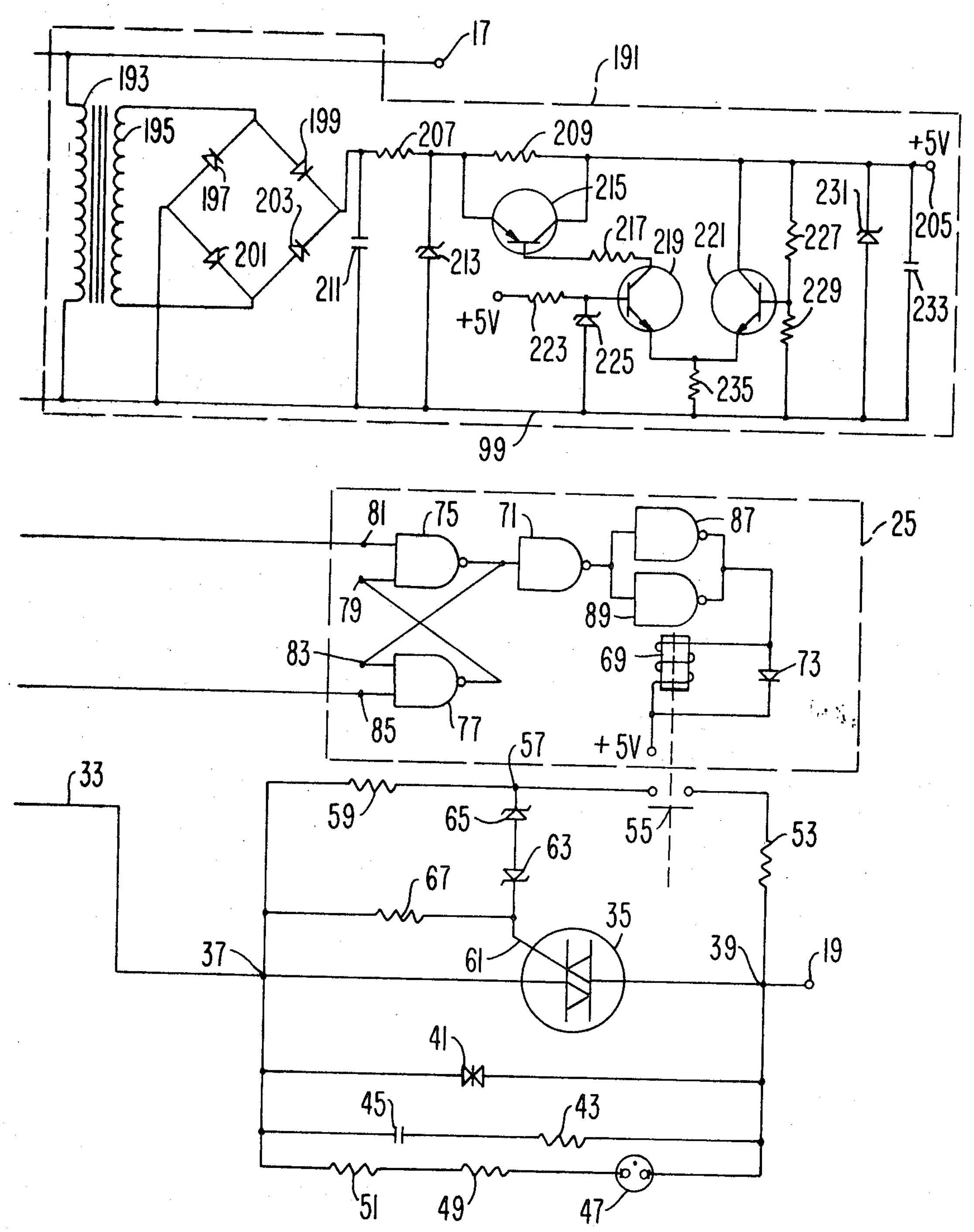

FIG. 2B also shows a power supply system 191. It is to be understood that the specific design of the power supply forms no part of this invention and any suitable source of DC voltage would suffice. The power supply is described in order to provide a complete description of the preferred embodiment of the synchronous-switching circuit of this invention.

The power supply 191 includes a main transformer coil 193 which is connected between AC inputs 11 and 13. A secondary transformer coil 195 has one end connected to a point in a diode rectifier bridge where the cathode of a diode 197 is connected to the anode of a diode 199, and the other end of the secondary transformer coil 195 is connected to a point in the diode rectifier bridge where the cathode of a diode 201 is connected to the anode of a diode 203. The anodes of diodes 197 and 201 are connected to junction 99 and the cathodes of diodes 199 and 203 are connected to a +5 volt DC output 205 via a series current path comprising resistors 207 and 209. A capacitor 211 is connected between junction 99 and the cathodes of diodes 199, 203. A zener diode 213 has its anode connected to junction 99 and its cathode connected to the junction of resistors 207 and 209, the other end of resistor 207 being connected to the cathodes of diodes 199, 203.

A series regulator transistor 215 is connected across resistor 209 with its emitter being connected to the junction of resistors 207 and 209, and its collector being connected to the other end of resistor 209 at the +5 volt DC output 205. The base of transistor 215 is connected through resistor 217 to the collector of transistor 219 of a differential amplifier comprising transistors 219 and 221. The emitters of transistors 219 and 221 are connected to junction 99 via resistor 235. The base of transistor 219 is connected through resistor 223 to the +5 volt DC source (supplied by output 205) and to junction 99 through zener diode 225 which is poled with its anode being connected to junction 99. The collector of transistor 221 is connected to the +5 volt DC output 205. The base of transistor 221 is connected to the junction point of resistor 227 and resistor 229 which form a voltage divider between the +5 volt DC output 205 and junction 99. The cathode of zener diode 231 is connected to the +5 volt DC output 205 and anode to junction 99. A capacitor 233 is connected across the +5 volt DC output 205 to junction 99. Zeners 213, 231 are to protect the regulator from power line transients.

The operation of the synchronous-switching control circuit of this invention will now be described with reference to FIGS. 1, 2A and 2B.

The circuit of this invention responds to the actuation of the power-on/power-off switch 29 to trigger the conduction of a triac 35 thereby energizing a load from an AC source at that point in the AC waveform at which the magnitude of the source current is approximately zero. The actuation of switch 29 will complete a circuit between AC source input 11 and the base of sensing transistor 91. This will apply drive current to the base of transistor 91 causing it to conduct. The conduction of transistor 91 ignites neon bulb 95 and causes the collector potential to fall. This results in a low condition which is applied to junction 167, the input of NAND gate 157, via lead 101. The presence of a low at junction 167 causes the output of NAND gate 157 to go high. This output will attempt to make the input 171 of NAND gate 165 go high, but junction 171 will be held low by the output of NAND gate 163.

When the AC waveform at input 11 goes in a positive direction and reaches the predetermined range or zone in that waveform, diodes 107 and 109 then become forward-biased and cause the capacitor 117 to charge. Because diode 119 is reverse-biased during the charging of capacitor 117, the capacitor 117 will charge through the emitter-base junction of transistor 113 and cause transistor 113 to switch to a conductive state. The conduction of transistor 113 causes the collector potential to go low. This low condition is transmitted to the input of NAND gate 163 via output lead 127 and causes the output of NAND gate 163 to go high. The output of NAND gate 163 and the output of NAND gate 157 combine their respective high conditions at junction 171 and cause the first input of NAND gate 165, represented by junction 171, to go high.

The second input of NAND gate 165, taken from junction 173, is controlled by the output of the holding circuit including diode 175, capacitor 177 and resistor 179. Once the capacitor 177 has reached the peak charge, shortly after the initial application of power to the circuit, the second input of NAND gate 165 goes high. When both inputs of NAND gate 165 are high, the output goes low, causing the output of NAND gates 87, 89 to go low, thereby energizing reed relay 69 and closing relay-operated switch 55.

The closure of relay-operated switch 55 allows the required gate-biasing potential to be generated by resistor 59, resistor 53, zener diode 63 and zener dode 65. The generation of this gate-biasing potential at the gate 61 of triac 35 switches the triac to a conductive state thereby energizing the load from the AC source. The continued presence of this gate-biasing potential permits triac 35 to re-trigger each half cycle.

The synchronous-switching control circuit of this invention also operates to remove a source of AC power from the load after the deactuation of the power-on switch (the actuation of a power-off switch) at that point in the AC waveform at which the load current is approximately zero.

The power-off cycle operates as follows: The actuation of the power-off switch opens switch 29 thereby removing the base drive current from the base of transistor 91. Neon bulb 95 is extinguished and the sensing transistor 91 ceases to conduct. The voltage at the collector increases and places a high condition on one input of NAND gate 161 via output lead 101. The high will not develop immediately at the collector of sensing transistor 91 but may take one or more cycles due to the RC time constant of resistors 103, 105 and capacitor 169 which is chosen so as to prevent a high from developing during the negative portion of the AC waveform when sensing transistor 91 is off. Hence the presence of a high at junction 167 can only mean that the power switch 29 has been opened.

When the AC waveform at AC input 11 goes negative, the diodes 143, 145 respond and capacitor 137 charges. Once the sine wave starts in the positive direction, (i.e., when a negative peak has been reached), capacitor 137 will discharge drawing current through the emitter-base junction of sensing transistor 135 causing it to switch to a conductive state. The conduction of transistor 135 results in the production of a low on its collector and this low state is transmitted via lead 153 to the input of NAND gate 159 whose output forms the second input of NAND gate 161.

Hence, when transistor 91 is in a non-conductive state and transistor 135 is in a conductive state, both inputs of NAND gate 161 are high and the output of NAND gate 161 will go low. This low is applied to junction 173 and presented as a reset signal at input 81. The presence of the reset signal will cause the latching flip-flop to change to a reset state and the output of NAND gate 75 will go high causing the output of NAND gates 87, 89 to go high.

The presence of the high at the output of NAND gates 87, 89 will de-energize reed relay 69 causing relay-operated switch 55 to open. The opening of switch 55 removes the source of gate-biasing potential from the gate 61 of triac 35 and when the magnitude of the load current passing through the triac goes below the minimum holding current required to sustain conduction, the triac will turn off, thereby removing the 230 VAC from the load. Since this only occurs when the magnitude of the load current drops below the holding current and since the holding current is very small, the triac 35 switches to a non-conductive state at the approximate point in the AC cycle at which the load current is approximately zero. The triac is unable to re-trigger because of the absence of the required gate-biasing potential at gate 61.

Hence, it is seen that the circuit of this invention operates as a zone or peak-detecting synchronous switch in that it utilizes the detection of positive and negative zones or peaks only once during the power-on/power-off sequence. The detection of the first positive zone or peak after the power-on switch is actuated turns the triac on. The triac remains on (e.g. is able to be retriggered during each half cycle) until the first negative zone or peak is detected after the deactuation of the power-on switch.

It will be noted that the circuit does not necessarily act as a peak detector because, as stated hereinbefore, the turn-on and turn-off zones can be established as desired. It will be noted that the circuit timing takes into consideration the operating speed of reed relay 69. In the prime embodiment herein described, power will be applied to the load at a point between 75 and 90 degrees of the input sine wave. This is because the zone-sensing transistor 113 conducts while the sine wave is approaching its peak. It then sets the latch flip-flop that energizes the reed relay 69. The reed relay takes several milli-seconds to pick and once it picks, the gate-biasing potential is applied to the gate 61 of triac 35, the triac is triggered into a conductive state, and 230 VAC is applied to the load.

It will also be noted that power is removed from the load at some point between 360° and 450° of the sine wave. This is because the transistor 135 conducts while capacitor 137 discharges which means that transistor 135 will conduct between 270° and 290°. This results in the latch flip-flop being reset which de-energizes the reed relay 69. The reed relay takes several milli-seconds to drop out and, if the load is resistive, the triac will turn off at 360°, while a highly inductive load will cause the triac to conduct until about 450°.

This circuit is thus able to control the application and removal of alternating current from a load by sensing a random actuation or deactuation of a power-on/power-off switch and by sensing a predetermined zone or point in the AC waveform. Logic circuitry responsive to these conditions is used to control a latching flip-flop which in turn controls the application or removal of the gate-biasing potential at the gate of a triac switch connecting the source to the load.

With this detailed description of the operation of the present invention it wil be obvious to those skilled in the art that various modifications can be made without departing from the spirit and scope of the invention which is limited only by the appended claims.

I claim:

1. A synchronous-switching control circuit adapted to enable a load to be selectively energized and de-energized from a source of alternating current at a point of substantially zero circuit current in response to a random actuation and deactuation of a power switch, said control circuit comrpising:

means responsive to a predetermined range in the positive portion of the AC waveform of said alternating current for generating a first signal and responsive to a predetermined range in the negative portion of the AC waveform of said alternating current for generating a second signal, gate-controlled, bidirectional current-carrying switching means connected between said source and said load for energizing said load in response to the presence of a gate-biasing potential and for de-energizing said load in response to the absence of said gate-biasing potential, and means responsive to the random actuation of said power switch in conjunction with said first signal for appling said gate-biasing potential to said switching means and responsive to the random deactuation of said power switch in conjunction with said second signal for removing said gate-biasing potential, said responsive means for applying and removing said gate biasing potential includes:

a latch flip-flop having first and second stable states, first logical gating means responsive to the random actuation of said power switch in conjunction with said first signal for switching said latch flip-flop to said first stable state, second logical gating means responsive to the random deactuation of said power switch in conjunction with said second signal for switching said latch flip-flop to said second stable state, and circuit means responsive to the first stable state of said latch flip-flop for applying said gate-biasing potential to said switching means and responsive to the second stable state of said latch flip-flop for removing said gate-biasing potential.

2. The synchronous-switching control circuit of claim 1 wherein said circuit means includes:

relay means including a relay coil, said relay means responsive to the first stable state of said latch flip-flop for energizing said relay coil and responsive to the second stable state of said latch flip-flop for de-energizing said relay coil, and means for generating said gate-biasing potential, said generating means including a relay-operating switching means responsive to the energization of said relay coil for applying said gate-biasing potential to said gate-controlled bidirectional switching means and responsive to the de-energization of said relay coil for removing said gate-biasing potential from said gate-controlled bidirectional switching means.

3. The control circuit of claim 2 wherein said gate-controlled bidirectional current-carrying switching means includes a triac having a first load electrode connected to said source of alternating current, a second load electrode connected to said load, and a gate electrode coupled to said means for generating said gate-biasing potential.

4. A synchronous-switching control circuit adapted to enable a load to be selectively energized and de-energized from a source of alternating current at a point of substantially zero circuit current in response to a random actuation and deactuation of a power switch, said control circuit comprising:

means responsive to a predetermined range in the positive portion of the AC waveform of said alternating current for generating a first signal and responsive to a predetermined range in the negative portion of the AC wave form of said alternating current for generating a second signal, gate-controlled, bidirectional current-carrying switching means connected between said source and said load for energizing said load in response to the application of a gate-biasing potential to said switching means and responsive to the random deactuation of said power switch in conjunction with said second signal for removing said gate-biasing potential, and wherein said responsive means for generating said first and second signals includes:

first circuit means including a first transistor for generating said first signal upon the attainment of some value within said predetermined range in the positive portion of said AC waveform, and second circuit means including a second sensing transistor for generating said second signal upon the attainment of some value within said predetermined range in the negative portion of said AC waveform.

5. The control circuit of claim 4 wherein said first circuit means includes a first charging capacitor, and a first diode means responsive to the positive portion of said AC waveform for controlling the charging and discharging of said first capacitor, switching said first transistor to a conductive state and generating said first signal, and wherein said second circuit means includes a second charging capacitor, and a second diode means responsive to the negative portion of said AC waveform for controlling the charging and discharging of said second capacitor, triggering said second sensing transistor to a conductive state and producing said second signal.

6. In a synchronous-switching system wherein a gate-controlled bidirectional switching element is used to control the application of power from an AC source to a load in response to the random actuation and deactuation of a power switch such that a gating potential is applied to the gate of said switching element at that point in the AC cycle at which the source current is approximately zero for driving said switching element into a conductive state, said switching element continuing to energize the load until, in response to the deactuation of said power switch, the gating potential is removed and said switching element is switched to a non-conductive state at that point in the AC cycle at which the load current is approximately zero and said switching element is no longer able to sustain conduction, a control circuit for controlling the application and removal of said gating potential comprising:

means for sensing the actuation and deactuation of said power switch;

means for detecting a predetermined positive zone in the AC cycle and for detecting a predetermined negative zone in the AC cycle, first logic means responsive to the sensing of said actuation of said power switch and to said means for detecting a positive zone for generating a set signal, second logic means responsive to the sensing of said deactuation of said power switch and to said means for detecting a negative zone for generating a reset signal, and latching means responsive to said set signal for enabling the application of said gating potential to the gate of said switching element and responsive to said reset signal for enabling the removal of said gating potential from the gate of said switching element.

7. The control circuit of claim 6 wherein said latching means includes:

circuit means including a relay-operated switch, said circuit means including means responsive to the closure of said relay-operated switch for applying said gating potential to the gate of said bidirectional switching element and responsive to the opening of said relay-operated switch for removing said gating potential from the gate of said bidirectional switching element, relay means for controlling said relay-operated switch, and bistable flip-flop means responsive to said set signal for energizing said relay means and closing said relay-operated switch and responsive to said reset signal for de-energizing said relay means and opening said relay-operated switch.

8. The control circuit of claim 7 wherein said sensing means includes means responsive to the actuation of said power switch for generating a signal indicative thereof and responsive to the deactuation of said power switch for inhibiting the generation of said signal indicative of the actuation of said power switch.

9. The control circuit of claim 8 wherein said means for detecting a positive zone includes:

a first current-conducting means having a first and second current-carrying electrode and a control electrode, first capacitive means coupled to said control electrode for switching said first current-carrying means to a conductive state upon the attainment of a predetermined approximate charge on said capacitive means, and means for charging said first capacitive means only during the positive portion of said AC waveform.

10. The control circuit of claim 9 wherein said means for detecting a negative zone includes:

a second current-carrying element having first and second current-carrying electrodes and a control electrode, second capacitive means coupled to the control electrode of said current-carrying element for switching said current-carying element to a conductive state upon the attainment of a predetermined approximate charge on said capacitive means, and means for charging said second capacitive means only during the negative portion of said AC cycle.

11. The control circuit of claim 10 wherein said first logic means includes a plurality of logical NAND gates responsive to the generation of said signal indicative of a power switch actuation and to a conductive state of said first current-carrying means for generating said set signal and wherein said second logic means includes a plurality of logical NAND gates responsive to the absence of said signal indicative of a power switch actuation and to a conductive state of second current-carrying means for generating said reset signal.

12. The synchronous switching system of claim 11 wherein said bidirectional switching element includes a triac, wherein said first current-carrying element and said second current-carrying element are first and second transistors respectively, wherein said first capacitive charging means includes at least one diode, and wherein said second capacitive charging means includes at least one diode.

13. A control circuit for responding to the actuation of a power switch to couple a source of alternating current to a load at that point in the alternating current cycle at which the magnitude of the source current is approximately zero and for responding to the deactuation of the power switch to de-couple the source from the load at that point in the alternating current cycle at which the load current is approximately zero, said control circuit comprising:

gate-controlled switching means, having a first load electrode coupled to said generating of alternating current, a second load electrode coupled to said load, and a gate electrode, said switching means being responsive to the presence of a triggering potential at said gate electrode for switching said switching means into a conductive state and being responsive to the absence of a triggering potential at said gate electrode and to the magnitude of the current passing through said first and second load electrodes falling below a predetermined value required to maintain said switching element in said conductive state for rendering said switching element non-conductive, first sensing means responsive to the actuation of said power switch for generating a first signal and responsive to the deactuation of said power switch for inhibiting the generation of said first signal, second sensing means responsive to a predetermined zone in the positive portion of the waveform of said alternating current, third sensing means responsive to a predetermined zone in the negative portion of the waveform of said alternating current, first logical gating means responsive to said first signal and to said second sensing means for generating a set signal, second logical gating means responsive to the inhibition of said first signal and to said third sensing means for generating a reset signal, bistable latching means including a reed relay, said bistable latching means responsive to said set signal for energizing said reed relay and to said reset signal for de-energizing said reed relay, and means for generating said triggering potential, said triggering potential-generating means including a relay-operated switching means responsive to the energization of said reed relay for applying said triggering potential to said gate electrode and responsive to the de-energization of said reed relay for removing said triggering potential from said gate electrode.

14. The control circuit of claim 13 wherein said gate-controlled switching means includes a triac.

15. The control circuit of claim 14 wherein said first sensing means includes a first transistor and RC circuit means responsive to the actuation of said power switch for switching said first transistor to a conductive state and generating said first signal at the collector thereof and responsive to the deactuation of said power switch for switching said first transistor to a non-conductive state and inhibiting the generation of said first signal at the collector of said first transistor.

16. The control circuit of claim 15 wherein said second sensing means includes a second transistor and second circuit means for establishing a predetermined turn-on zone within the positive portion of the waveform of said alternating current and for switching said second transistor to a conductive state at some point within said turn-on zone.

17. The control circuit of claim 16 wherein said means for establishing a turn-on zone and for switching said second transistor to a conductive state at some pont within said turn-on zone includes a first charging capacitor coupled to the base of said second transistor and first diode means responsive to the positive portion of said AC waveform for charging said first capacitor.

18. The control circuit of claim 17 wherein said third sensing means includes a third transistor and third circuit means for establishing a predetermined turn-off zone within the negative portion of the waveform of said alternating current and for switching said third transistor to a conductive state at some point within said turn-off zone.

19. The control circuit of claim 18 wherein said means for establishing a turn-off zone and for switching said third transistor to a conductive state at some point within said turn-off zone includes a second charging capacitor coupled to the base of said third transistor and second diode means responsive to the negative portion of the AC cycle for enabling the charging and discharging of said second charging capacitor.

* * * * *